(12) United States Patent
Song

(10) Patent No.: US 8,581,278 B2
(45) Date of Patent: Nov. 12, 2013

(54) LIGHT-EMITTING DIODE PACKAGING STRUCTURE

(75) Inventor: Wen-Joe Song, Taipei (TW)

(73) Assignee: Kingbright Electronic Co., Ltd., Taipei Hsien (TW)

( * ) Notice: Subject to any disclaimer, the term of this patent is extended or adjusted under 35 U.S.C. 154(b) by 1304 days.

(21) Appl. No.: 11/783,211

(22) Filed: Apr. 6, 2007

(65) Prior Publication Data

US 2008/0246045 A1   Oct. 9, 2008

(51) Int. Cl.
*H01L 33/00* (2010.01)

(52) U.S. Cl.
USPC 257/98; 257/99; 257/E33.055; 257/E33.056; 257/E33.057; 257/E33.058; 257/E33.059

(58) Field of Classification Search
USPC ............... 257/98–99, E33.055–E33.059
See application file for complete search history.

(56) References Cited

U.S. PATENT DOCUMENTS

| 2002/0130326 A1* | 9/2002 | Tamura et al. ............... 257/79 |
| 2006/0079014 A1* | 4/2006 | Song ............................ 438/22 |
| 2006/0157828 A1* | 7/2006 | Sorg ........................... 257/666 |
| 2011/0175132 A1* | 7/2011 | Kwon et al. .................. 257/98 |

OTHER PUBLICATIONS

Merriam-Webster OnLine Dictionary Definition of "window."*
Merriam-Webster OnLine definition of "enclose."*
Merriam-Webster OnLine definition of "confine."*
MerriamWebster OnLine definition of "cover." No Date.*

* cited by examiner

*Primary Examiner* — Hrayr A Sayadian
(74) *Attorney, Agent, or Firm* — Rosenberg, Klein & Lee

(57) ABSTRACT

A light-emitting diode packaging structure includes a thermally conductive substrate; a circuit layer provided on one surface of the substrate and having an electric connection element; at least one chip mounted on the circuit layer to electrically connect to the electric connection element; a light-reflective case enclosing at least part of the substrate and being formed of a window, via which light emitted by the chip is projected outward; and a light-pervious colloidal seal fitted in the window of the case to form a protection around the chip. With the above structure, heat produced by the chip during operation thereof may be effectively radiated and dissipated via the thermally conductive substrate.

10 Claims, 5 Drawing Sheets

LIGHT-EMITTING DIODE PACKAGING STRUCTURE

FIELD OF THE INVENTION

The present invention relates to a light-emitting diode packaging structure, and more particularly to a light-emitting diode packaging structure enabling high heat radiation efficiency.

BACKGROUND OF THE INVENTION

With the advancement in technology, various types of light emitting elements having low power consumption and high luminous efficiency are developed. Among others, light-emitting diode (LED) has relatively low power consumption and relatively high light efficiency, and therefore has gradually replaced the cold cathode fluorescent lamp (CCFL) and other existing illuminating light sources. However, heat produced by the light-emitting diode during operation thereof is still a problem to be solved. A proper heat radiating design would increase the luminous power and service life the light-emitting diode. Therefore, the successful development of light-emitting diode lies in the effective radiation of heat produced by the LED during operation thereof.

In conventional high-power light-emitting diodes, for the purpose of heat radiation, the chip is fixedly mounted on a heat radiating element or strip and electrically connected to a lead frame via conductive leads. Heat produced by the chip during operation thereof is directly radiated and dissipated via the heat radiating element or strip. However, the heat radiating element or strip is additionally provided to inevitably increase the material and assembling costs of the light-emitting diode. And, due to limited available space, the heat radiating element or strip generally has insufficient radiating area and efficiency to satisfy the requirement of radiating heat over a long period of time. Therefore, there is accumulated heat having adverse influence on the luminous efficiency and service life of the conventional light-emitting diodes.

It is therefore tried by the inventor to develop an improved light-emitting diode packaging structure to eliminate drawbacks existed in the conventional light-emitting diode packaging structures.

SUMMARY OF THE INVENTION

A primary object of the present invention is to provide a light-emitting diode packaging structure that enables excellent heat radiation efficiency to effectively increase the luminous power and service life of the light-emitting diode.

Another object of the present invention is to provide a light-emitting diode packaging structure that has simple structure to enable easy assembly thereof at reduced manufacturing cost.

To achieve the above and other objects, the light-emitting diode packaging structure of the present invention includes a thermally conductive substrate having a first and a second surface, and being provided within a predetermined enclosed portion with at least one recess or one hole, or with both the recess and the hole, and the first surface being at least partially in contact with air; a circuit layer being provided on the second surface of the substrate and having an electric connection element; at least one chip mounted on the circuit layer to electrically connect to the electric connection element; a light-reflective case enclosing at least part of the substrate and being formed of a window; and a light-pervious colloidal seal fitted in the window of the case to form a protection around the chip, such that light emitted by the chip is projected outward via the colloidal seal in the window. With the above structure, heat produced by the chip during operation thereof may be effectively radiated and dissipated via the thermally conductive substrate.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
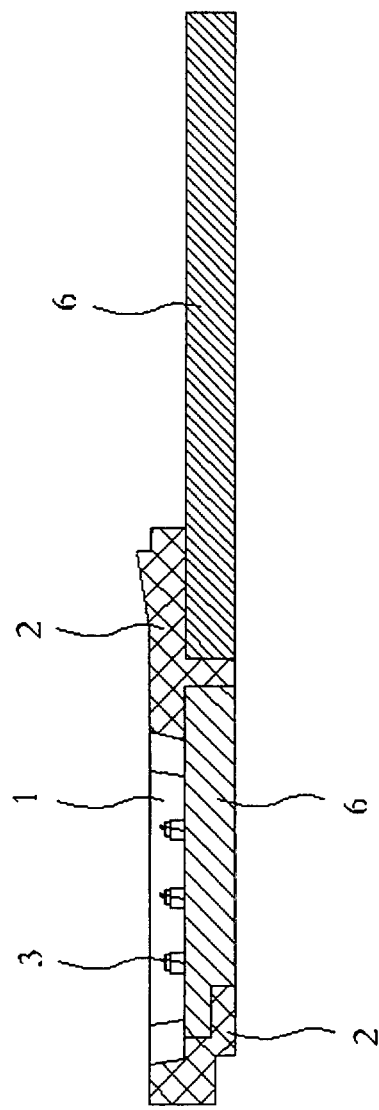
FIG. 1 is a sectional view of a light-emitting diode packaging structure according to a first embodiment of the present invention.
Figure 2:
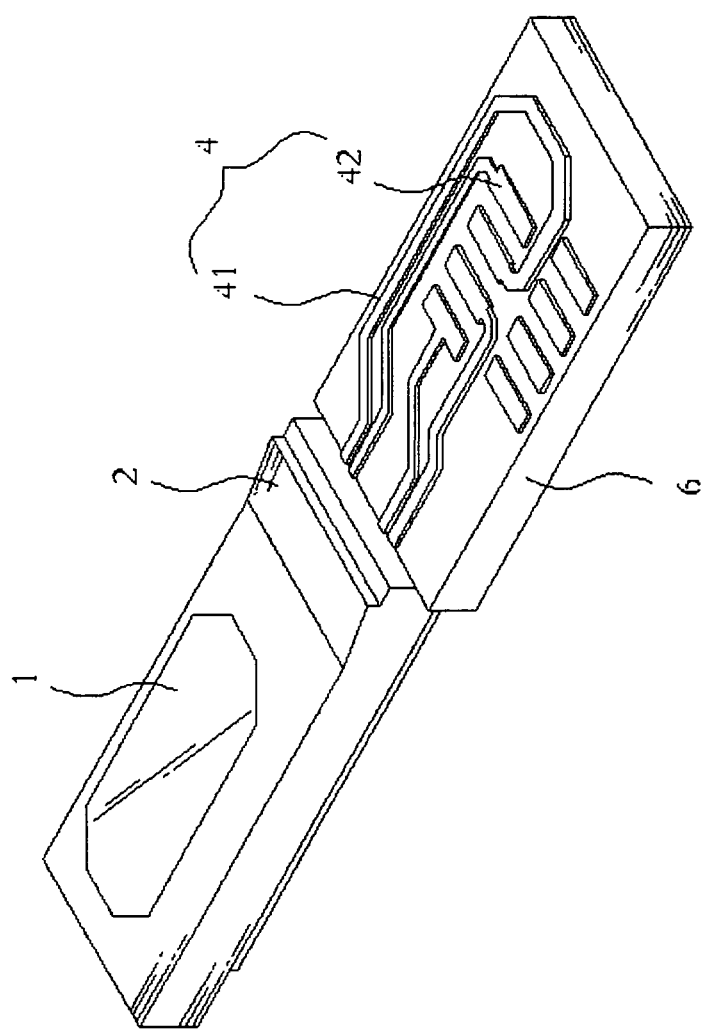
FIG. 2 is an assembled top perspective view of the light-emitting diode packaging structure of FIG. 1.
Figure 3:
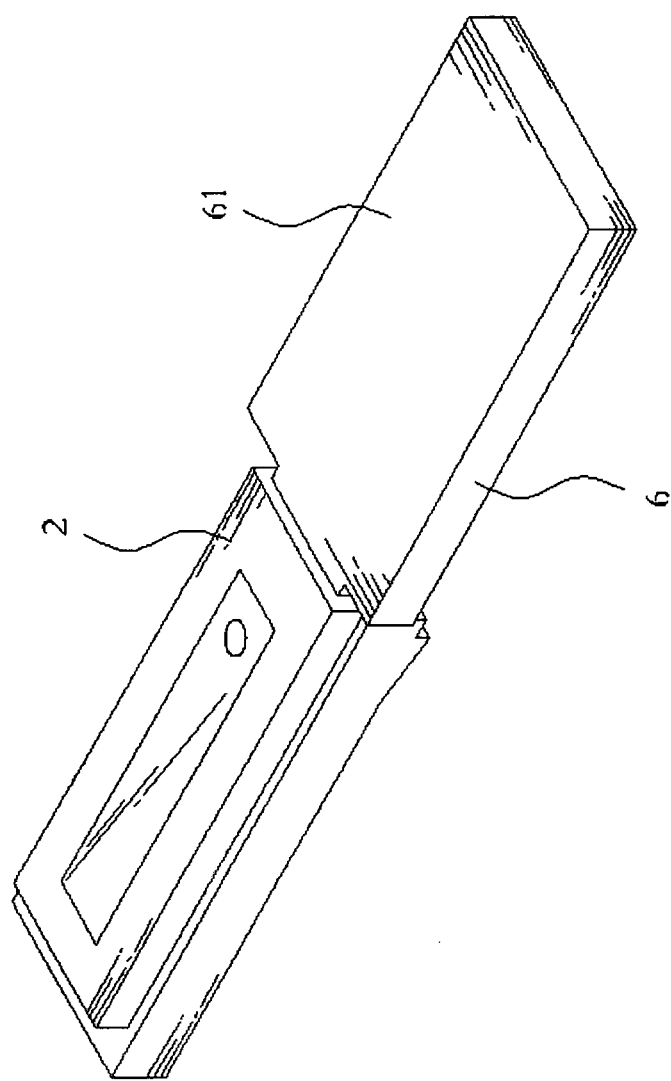
FIG. 3 is a bottom view of FIG. 2.
Figure 4:
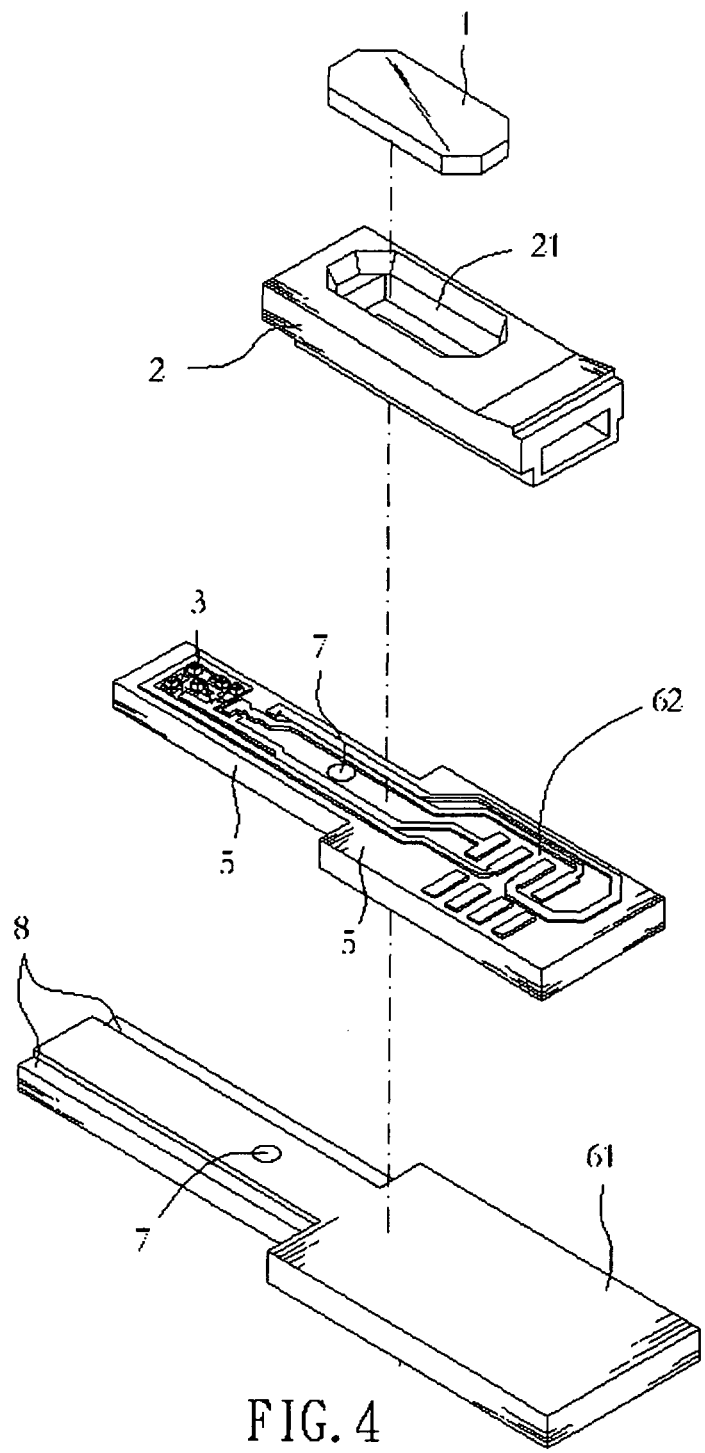
FIG. 4 is an exploded view of FIG. 2.

Please refer to FIGS. 1 and 2 that are assembled sectional and top perspective views, respectively, of a light-emitting diode packaging structure according to a first embodiment of the present invention; and to FIGS. 3 and 4 that are bottom and exploded perspective views, respectively, of the light-emitting diode packaging structure of FIG. 2. As shown, the light-emitting diode packaging structure according to the first embodiment of the present invention includes a thermally conductive substrate 6, a circuit layer 5, a chip 3, a case 2, and a colloidal seal 1.

The thermally conductive substrate 6 may be a metal substrate or a ceramic substrate, and includes a first surface 61 and a second surface 62, and is provided within a predetermined enclosed portion with at least one hole 7, or at least one recess 8, or both the hole 7 and the recess 8.

The circuit layer 5 is provided on the second surface 62 of the substrate 6, and includes an electric connection element 4 having a plurality of conductive traces 41 and at least one pair of electric contacts 42.

The chip 3 is mounted on the circuit layer 5 by flip-chip mounting or wire bonding, and is electrically connected to the electric connection element 4. The electric connection element 4 may be selected from the group consisting of conductive traces 41, a flexible circuit board 40 (see FIG. 5), and a combination thereof.

The case 2 is made of a light-reflective and highly heat-resistant material for tightly and closely enclosing predetermined portions of the substrate 6 by way of injection-molding, molding, riveting, or bonding. The case 2 is formed of a window 21, via which the chip 3 can be seen from outside. A light-reflective substance is provided on an inner surface of the window 21 to facilitate reflection of light.

The colloidal seal 1 is light-pervious, and is fitted in the window 21 of the case 2 by way of injection, molding, or other suitable ways, so as to form a light-pervious protection around the chip 3. The colloidal seal 1 may be selected from the group consisting of silicone, epoxy resin, and a combination thereof.

When the light-emitting diode is in use, the chip 3 is electrically connected to an external apparatus via the electric connection elements 4 on the circuit layer 5. Light emitted by the chip 3 is diffused via the colloidal seal 1 in the window 21 of the case 2 to form a light source for illumination or display. Heat produced by the chip 3 during operation thereof is radiated and dissipated from the air-contacting first surface 61 of the thermally conductive substrate 6, so as to lower the temperature of the chip 3 and thereby effectively increase the luminous power and service life of the light-emitting diode.

Figure 5:
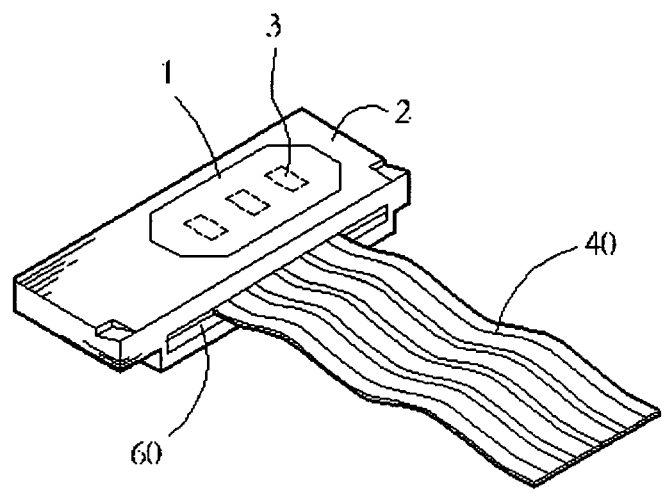
FIG. 5 is a perspective view of a light-emitting diode packaging structure according to a second embodiment of the present invention.

FIG. 5 is a perspective view of a second embodiment of the present invention. As shown, in the second embodiment, the present invention includes a thermally conductive substrate 6 having a properly reduced size compared to the first embodiment, so as to be entirely enclosed in the case 2. In the second embodiment, the colloidal seal 1 and the chip 3 are provided on the case 2, such that the chip 3 is electrically connected to an external apparatus via a flexible circuit board 40. In this manner, a light-emitting diode package with an effectively reduced overall volume may be obtained for advantageously using with miniaturized products.

With the above arrangements, the light-emitting diode packing structure of the present invention may be conveniently assembled at reduced cost while providing good heat radiation efficiency.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A light-emitting diode packaging structure, comprising:
   a thermally conductive substrate having a first and a second surface, and at least a part of said first surface being in contact with air;
   a circuit layer being provided on said second surface of said substrate, and including an electric connection element, and the electric connection element having a plurality of conductive traces and at least one pair of electric contacts, the conductive traces and the electric contacts disposed on one side of said thermally conductive substrate;
   at least one chip being mounted on said second surface of said substrate to electrically connect to said electric connection element on said circuit layer, heat produced by the chip during operation thereof radiated and dissipated from the air-contacting first surface of the thermally conductive substrate; and
   a light-reflective case fixedly enclosing part of said substrate, and having a window for receiving a light-pervious colloidal seal therein, such that light emitted by said at least one chip is projected outward via said colloidal seal in said window.

2. The light-emitting diode packaging structure as claimed in claim 1, wherein said thermally conductive substrate is a metal substrate.

3. The light-emitting diode packaging structure as claimed in claim 1, wherein said thermally conductive substrate is a ceramic substrate.

4. The light-emitting diode packaging structure as claimed in claim 1, wherein said thermally conductive substrate includes at least one recess located within a portion of said substrate being enclosed in said case.

5. The light-emitting diode packaging structure as claimed in claim 1, wherein said thermally conductive substrate includes at least one hole located within a portion of said substrate being enclosed in said case.

6. The light-emitting diode packaging structure as claimed in claim 1, wherein said thermally conductive substrate includes at least one recess and at least one hole located within a portion of said substrate being enclosed in said case.

7. The light-emitting diode packaging structure as claimed in claim 1, wherein said electric connection element is selected from the group consisting of conductive traces, a flexible circuit board, and a combination thereof.

8. The light-emitting diode packaging structure as claimed in claim 1, wherein said case is provided on an inner surface of said window with a light-reflective substance 9. The light-emitting diode packaging structure as claimed in claim 1, wherein said case is made of a highly heat-resistant material.

10. The light-emitting diode packaging structure as claimed in claim 1, wherein said colloidal seal is made of a material selected from the group consisting of silicone, epoxy resin, and a combination thereof.

\* \* \* \* \*